United States Patent
Oh et al.

(10) Patent No.: US 7,903,448 B2
(45) Date of Patent: Mar. 8, 2011

(54) RESISTANCE RANDOM ACCESS MEMORY HAVING COMMON SOURCE LINE

(75) Inventors: Hyung-Rok Oh, Yongin-si (KR); Sang-Beom Kang, Hwaseong-si (KR); Joon-Min Park, Dongjak-gu (KR); Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 107 days.

(21) Appl. No.: 11/964,142

(22) Filed: Dec. 26, 2007

(65) Prior Publication Data

US 2008/0175036 A1    Jul. 24, 2008

(30) Foreign Application Priority Data

Jan. 23, 2007  (KR) ................ 10-2007-0006916

(51) Int. Cl.
*G11C 11/00*    (2006.01)
(52) U.S. Cl. ....................................... 365/148; 365/158
(58) Field of Classification Search .................. 365/148, 365/154
See application file for complete search history.

(56) References Cited

U.S. PATENT DOCUMENTS

| 5,748,531 | A | 5/1998 | Choi |
| 6,084,799 | A | 7/2000 | Tanzawa et al. |
| 7,187,577 | B1 * | 3/2007 | Wang et al. .................... 365/158 |
| 2006/0067114 | A1 * | 3/2006 | Hachino et al. ............... 365/158 |

FOREIGN PATENT DOCUMENTS

KR    1020040002697 A    1/2004

* cited by examiner

*Primary Examiner* — Hoai V Ho
*Assistant Examiner* — Anthan T Tran
(74) *Attorney, Agent, or Firm* — Volentine & Whitt, PLLC

(57) ABSTRACT

A resistance random access memory (RRAM) having a source line shared structure and an associated data access method. The RRAM, in which a write operation of writing data of first state and second state to a selected memory cell is performed through first and second write paths having mutually opposite directions, includes word lines, bit lines, a memory cell array and a plurality of source lines. The memory cell array includes a plurality of memory cells each constructed of an access transistor coupled to a resistive memory device. The memory cells are disposed in a matrix of rows and columns and located at each intersection of a word line and a bit line. Each of the plurality of source lines is disposed between a pair of word lines and in the same direction as the word lines. A positive voltage is applied to a source line in a memory cell write operation. Through the source line shared structure, occupied chip area is reduced and, in a write operating mode, a bit line potential can be determined within a positive voltage level range.

9 Claims, 7 Drawing Sheets

RESISTANCE RANDOM ACCESS MEMORY HAVING COMMON SOURCE LINE

CROSS-REFERENCE TO RELATED APPLICATION

This U.S. non-provisional application claims priority under 35 U.S.C. §119 of Korean Patent Application 10-2007-0006916 filed on Jan. 23, 2007, the entire contents of which are hereby incorporated by reference.

BACKGROUND OF THE INVENTION

1. Field of the Invention

Embodiments of the invention relate to variable resistance semiconductor memory devices. More particularly, embodiments of the invention relate to a resistance random access memory (RRAM) having a common source line and an associated data access method.

2. Discussion of Related Art

Next generation nonvolatile memory devices are being developed for use in portable consumer products to provide high capacity and low power consumption. Next-generation memory devices include, for example, PRAMs (Phase change Random Access Memory) utilizing phase-change material that can be switched between two states, RRAMs (Resistance Random Access Memory) employing material having a variable resistance characteristic of complex metal oxides, and MRAMs (Magnetic Random Access Memory) having ferromagnetic material. A common characteristic of the various materials used to form next generation memory devices is that resistance values vary by the supplied current or voltage. In addition, the resistance value is maintained in these devices even when no current or voltage is supplied demonstrating the nonvolatile memory characteristic which obviates the need for refresh operations. In these devices, a memory cell is comprised of one switching device and one variable resistor. The variable resistor is connected between a bit line and the switching device. The switching device, which is constructed of an access transistor or diode, is typically coupled with the variable resistance and a word line.

A PRAM memory device may replace NOR flash memory typically utilized in mobile phones. In PRAMs, a variable resistor is formed of a chalcogenide alloy of germanium, antimony and tellurium (Ge—Sb—Te) called GST and the resistance of the material is changed by a change in temperature. When the variable resistor is formed of complex metal oxides disposed between top and bottom electrodes the device is most likely a RRAM. When a variable resistor is formed of an insulator disposed between top and bottom magnetic electrodes, the device may be an MRAM.

A data write operation in a PRAM is performed by applying voltage pulses having the same polarity with different amplitudes to a memory cell at different times. A phase change memory device produces a switch based on a setting and resetting temperature which causes the device to be sensitive to a change in neighboring temperature. On the other hand, in an RRAM device, material which has a characteristic resistance value is changed by the applied voltage or current to store information in a memory layer. Thus, two electrodes are provided with the memory layer and voltage or current is applied to the two electrodes. This simple structure reduces the size of the memory device.

FIG. 1 is a schematic diagram illustrating a conventional memory cell MC of an RRAM. Memory cell MC constitutes one cell having an access transsistor AT and a resistive memory device SE. The resistive memory device SE may be formed of a complex metal oxide VR disposed between a top electrode TE and a bottom electrode BE. The complex metal oxide may be chrome doped SrZrO3 or a thin film of polycrystal PrCaMnO3 material. The gate of access transistor AT is connected to word line WL, its source is connected to source line SL, and its drain is connected to bottom electrode BE of resistive memory device SE. Bit line BL is connected to top electrode TE. When data of a first state is written to memory cell MC current is applied in a first direction D1. When data of a second state is written to the memory cell MC is applied in a second direction D2. The RRAM is also called a bi-directional RRAM in that writing data of a first and second state is performed in mutually opposite directions. The first direction D1 indicates a current path where a positive voltage applied from the bit line reaches source line SL via memory cell MC, and may be referred to as a first write path. The second direction D2 indicates a reverse current path (second write path) where a voltage applied from source line SL reaches bit line BL via memory cell MC. When writing data through the first write path, the resistive memory device SE has a high resistance value. When writing data through the second write path, the resistive memory device SE has a resistance value which is lower by hundreds or thousands of times as compared with the resistance value associated with the first write path.

Data can be read from memory cell MC via the use of a sense amplifier, coupled to bit line BL that senses current flowing through the bit line. The through-current varies depending on whether the memory cell is under a set state '1' or under a reset state '0'. For example, the amount of through-current may be small because of a high resistance when the memory cell has a 'set' state and may be relatively large because of a low resistance when the memory cell is in a 'reset' state. Accordingly, the sense amplifier compares the through-current to the reference current to read data stored in the memory cell MC.

FIG. 2 illustrates a sectional view of a plurality of memory cells of FIG. 1 fabricated on a P substrate and its corresponding schematic circuit. A PCMO film 1 corresponds to VR and the platinum (Pt) layer forms the top electrode TE and bottom electrode BE. NMOS transistor 2, which is formed on a P-type substrate and whose gate is coupled to a word line, corresponds to access transistor AT Fabrication details of the memory cells shown in FIG. 2 are disclosed in U.S. Pat. No. 7,057,922. The plurality of memory cells shown constitute a memory cell array having a matrix of rows and columns (as shown in FIGS. 3 and 4) to have a high density memory capacity.

FIGS. 3 and 4 illustrate conventional memory cell array configurations. The cell array of FIG. 3 (the details of which are disclosed in U.S. Pat. No. 7,045,840) includes a source line disposed in the direction of a word line. However, different source lines are correspondingly disposed for memory cells coupled with different word lines. The cell array of FIG. 4 (the details of which are disclosed in U.S. Pat. No. 7,016,222) includes a source line disposed in the direction of the bit line which is perpendicular to a word line. The memory cell arrays as illustrated in FIGS. 3 and 4 are RRAM type devices where the layout of word lines and bit lines occupy valuable chip area. By reducing the number of source lines in the RRAM device, the utilized chip area would correspondingly be reduced.

In a write operation of FIGS. 3 and 4, it is difficult to keep a source line potential and a bit line potential within a positive voltage level range. For example, when writing data 1, a ground voltage is applied to the source line and a positive write voltage is applied to the bit line. When writing data 0, a ground voltage is applied to the source line and a negative write voltage is applied to the bit line. When writing data 0, a negative voltage generated from a negative voltage generator must be applied to the selected bit line. This requires installing a negative voltage generator within the memory chip. Accordingly, there is a need for an advanced layout structure of a RRAM memory cell array and associated data access method.

SUMMARY OF THE INVENTION

Exemplary embodiments of the present invention are directed to a resistance random access memory (RRAM) and an associated data access method in which a write operation of writing data having a first state and a second state to a selected memory cell is performed through first and second write paths formed in mutually opposite directions. In an exemplary embodiment, the (RRAM) includes a plurality of word lines; a plurality of bit lines; a memory cell array having a plurality of memory cells which are disposed at the intersections of said word and bit lines to form a matrix of rows and columns and each have an access transistor and a resistive memory device; and a plurality of source lines each disposed between every two word lines and in the same direction as said word lines, and each connected to source terminals of corresponding access transistors having gate terminals connected to corresponding two word lines. In the memory device, when a positive voltage is applied to a selected source line, said corresponding access transistors may receive said positive voltage via said source terminals. In this manner, the use of common source lines reduces the occupied chip area.

DESCRIPTION OF EMBODIMENTS

Figure 1:
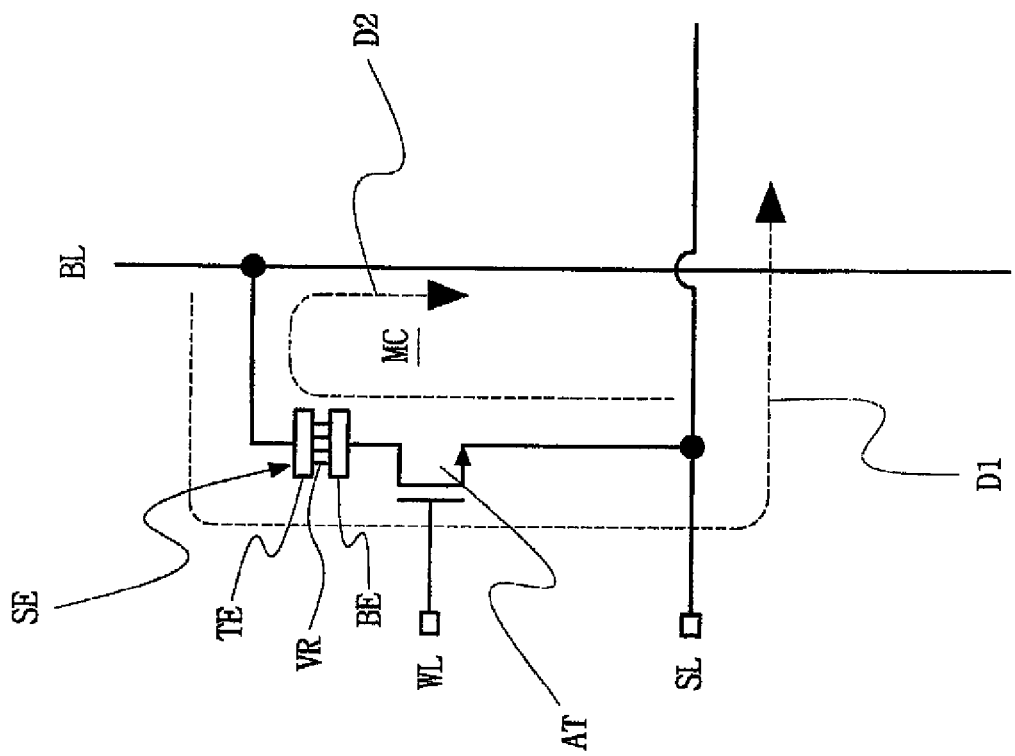
FIG. 1 is a schematic of a circuit illustrating a unit memory cell of an RRAM according to conventional art.
Figure 2:
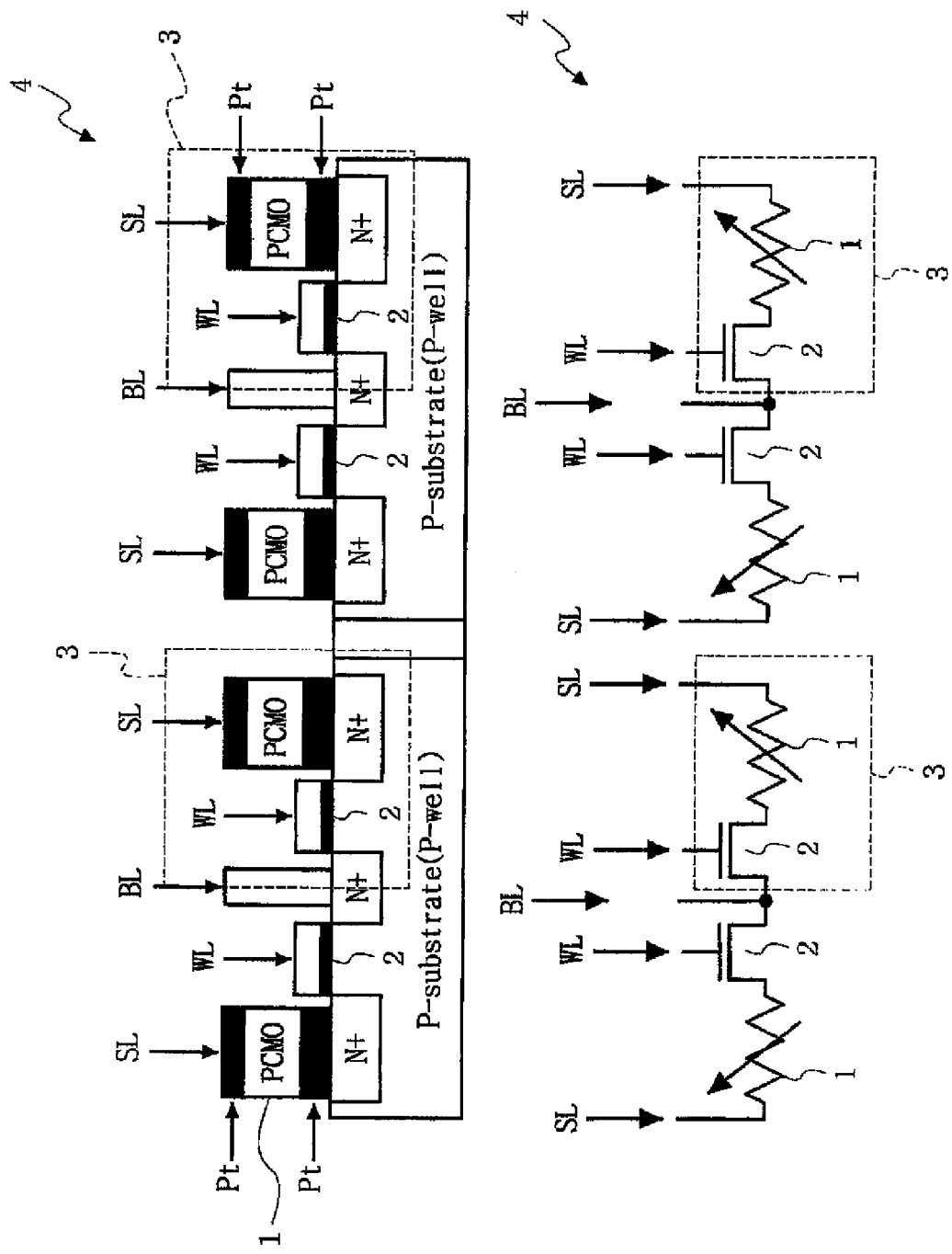
FIG. 2 illustrates a sectional view of a plurality of memory cells of FIG. 1 fabricated on a substrate and its corresponding equivalent circuit.
Figure 3:
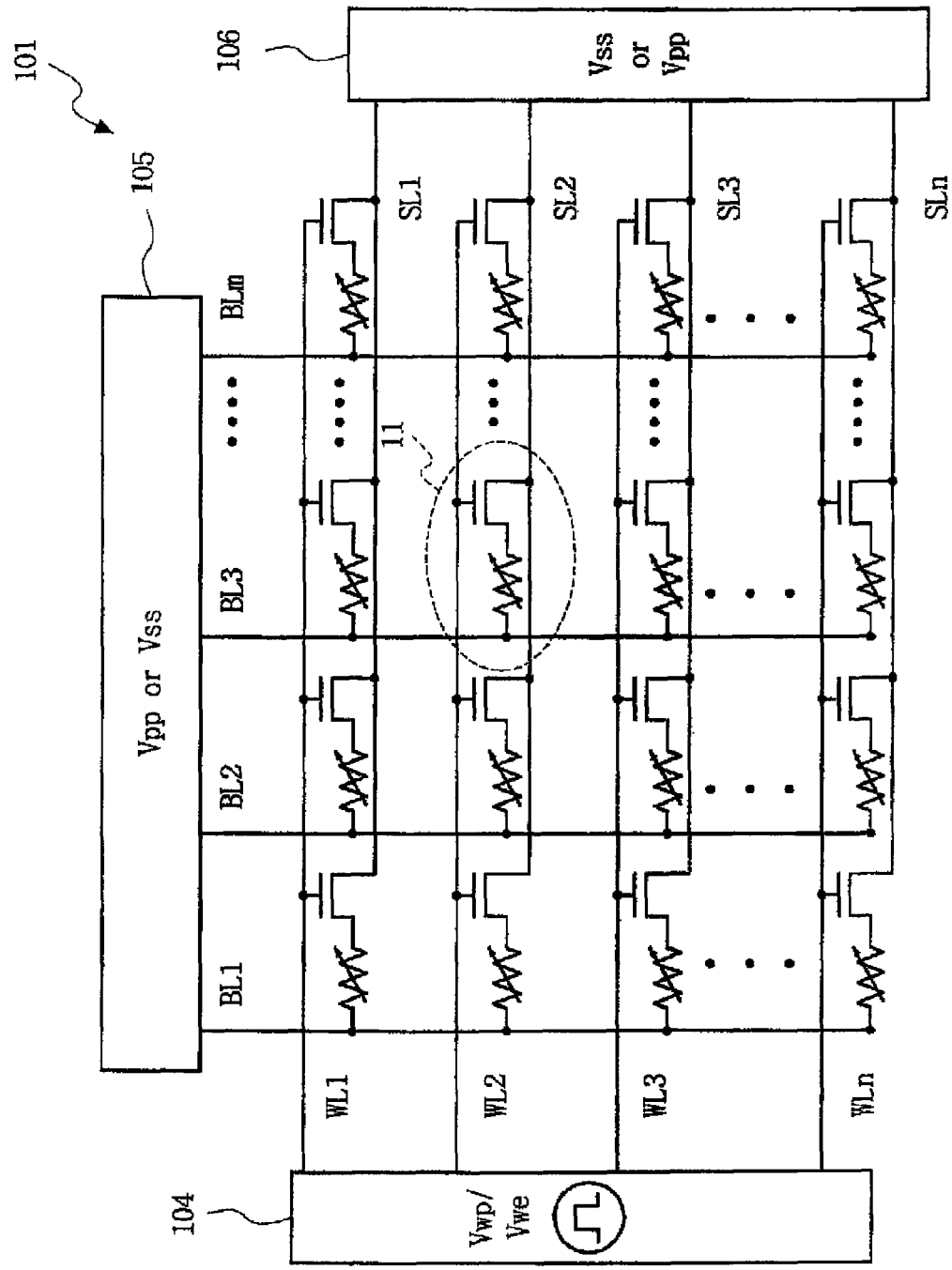
FIG. 3 illustrates a memory cell array according to an example of conventional art.
Figure 4:
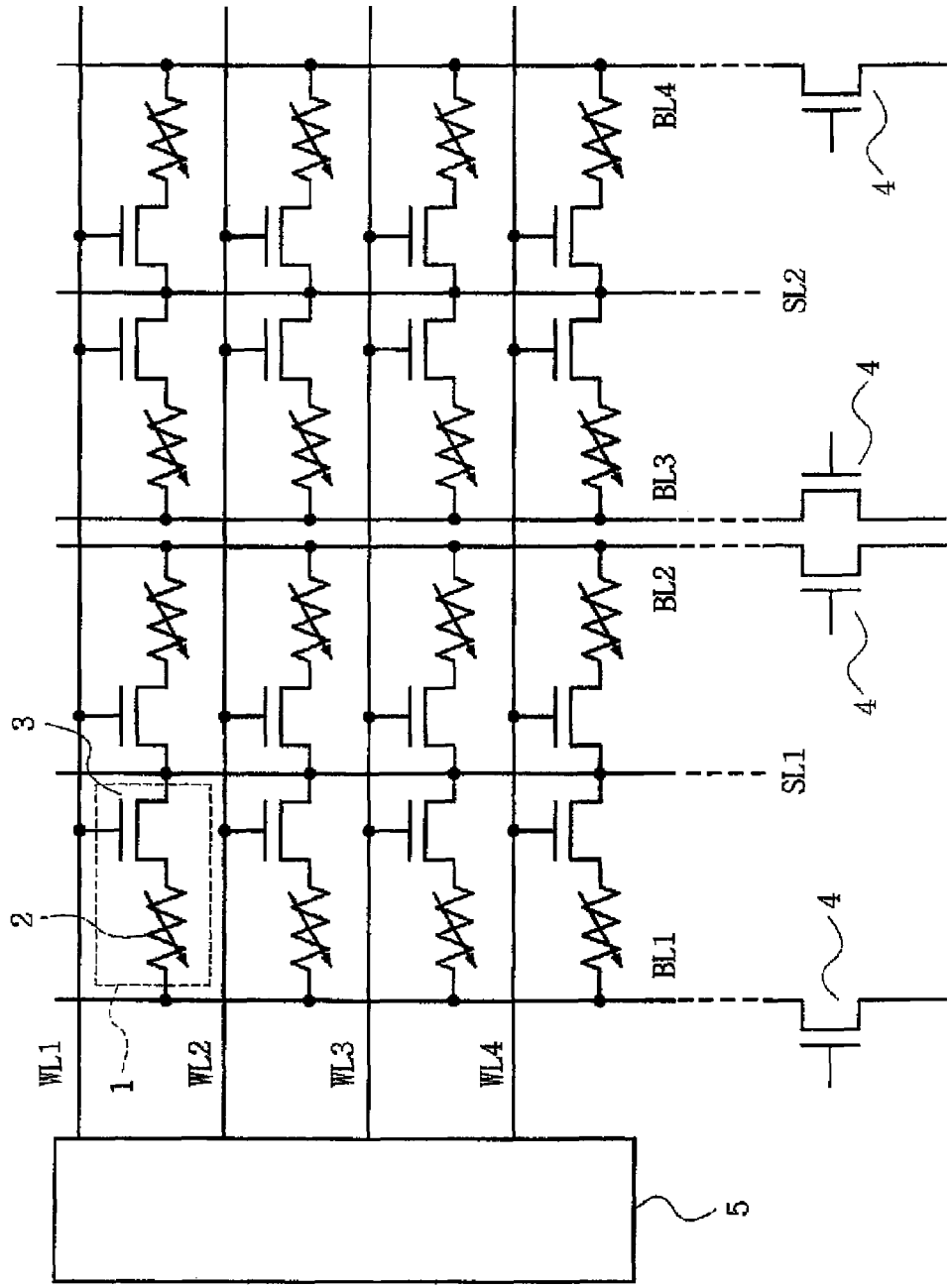
FIG. 4 illustrates a memory cell array according to another example of the conventional art.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 5:
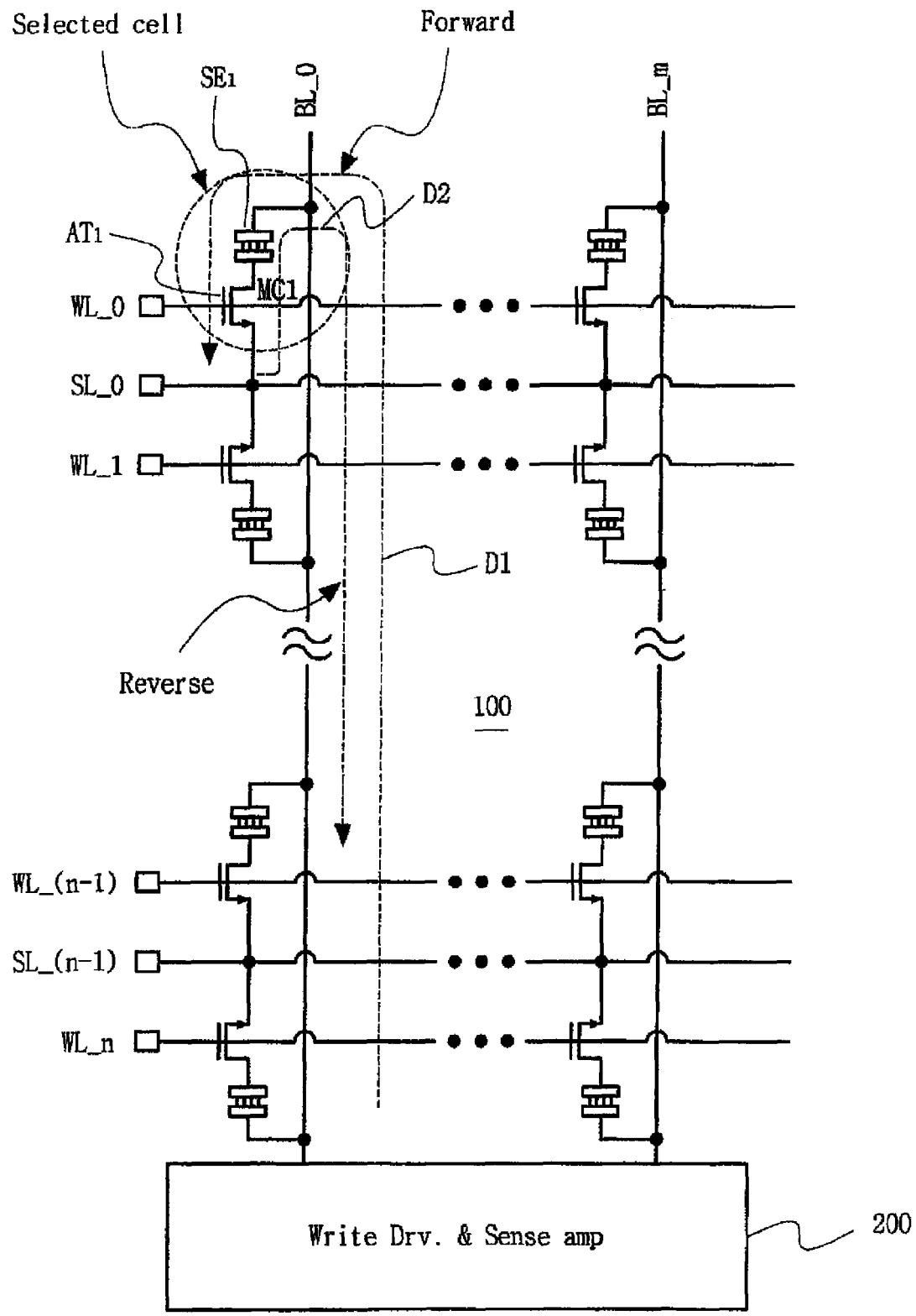
FIG. 5 illustrates a memory cell array according to the present invention.

FIG. 5 illustrates a memory cell array 100 of bidirectional resistance random access memory. Bit lines BL_0 to BL_m are coupled to write driver and sense amplifier 200. Bit lines BL_0 to BL_m are disposed perpendicularly to word lines WL_0 to WL_n. Source lines SL_0 to SL(n-1) are each disposed between adjacent word lines WL_0 to WL_n. First and second write paths D1 and D2 are used when writing data of first and second states to a selected memory cell, for example, memory cell MC1 of memory array 100. Exemplary memory cell MC1 is comprised of access transistor $AT_1$ and resistive memory device $SE_1$. The memory cell array 100 comprises a plurality of memory cells disposed in a matrix of rows and columns located at each intersection of word lines WL_0 to WL_n and corresponding bit lines BL_0 to BL_m. The source lines SL_0 to SL_(n-1) are disposed between the word lines in the same direction as the respective word line. For example, source line SL_0 is disposed between word lines WL_0 and WL_1 in the same direction as the word lines.

A first group of access transistors disposed above source line SL_0 have their respective source terminals coupled to source line SL_0 and their respective gate terminals coupled to word line WL_0. A second group of access transistors disposed below source line SL_0 have their respective gates coupled to adjacent word line WL_1 and their respective source terminals coupled in common to source line SL_0. Thus, the source terminals of the first and second group of access transistors are coupled to common source line SL_0. When a positive source voltage is applied through corresponding source line SL_0 in a write operating mode, the positive source voltage is applied to the source terminals of the first group of access transistors and the source terminals of the second group of access transistors. The source line shared structure of the access transistors reduces the number of source lines thereby reducing associated chip real estate occupied by the memory device. The source line potential and the bit line potential can be determined within a positive voltage level range by the operating conditions applied in the write operating mode. In writing data having different logic states to a memory cell sharing the same source line, the source line is configured to maintain a constant voltage which provides random write capability.

Figure 6:
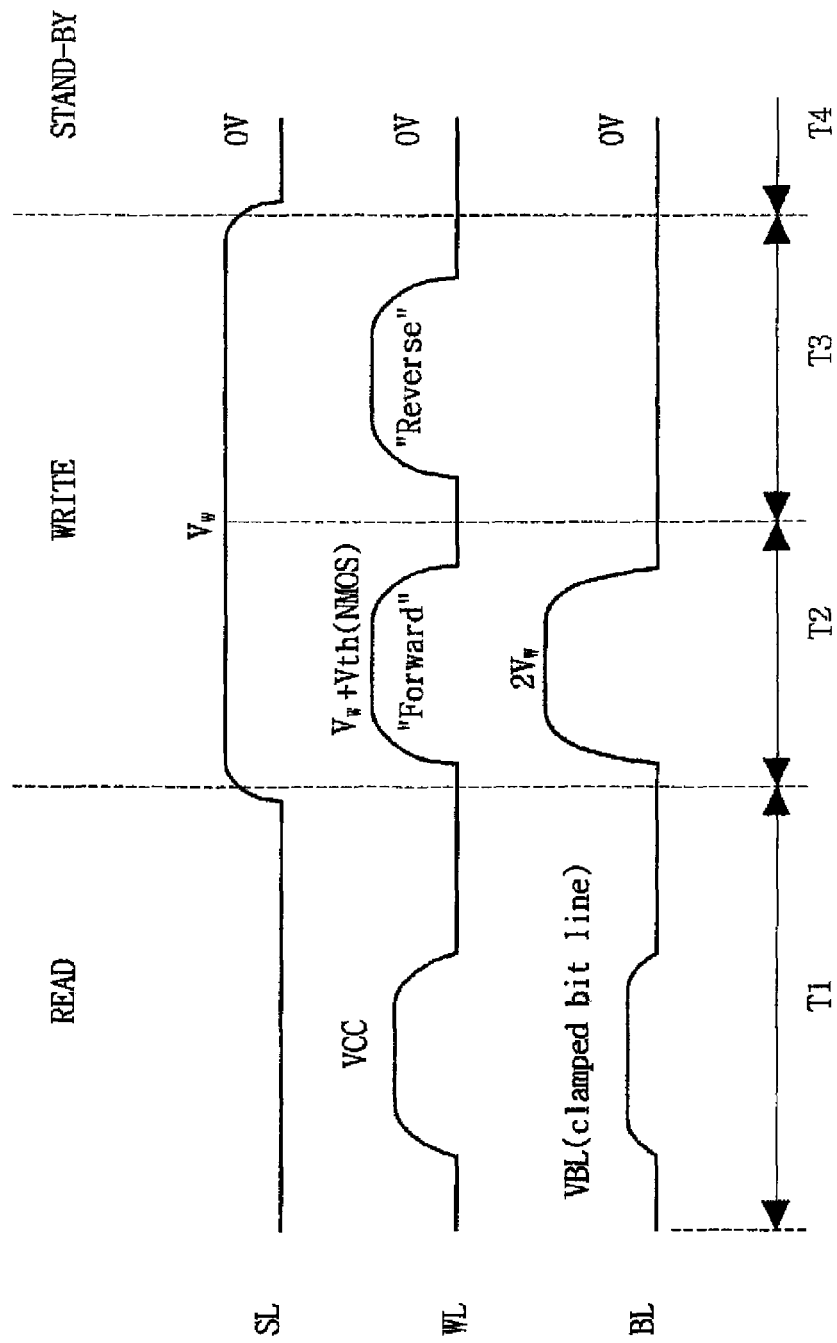
FIG. 6 is a timing diagram of applied drive voltages related to the operation of the memory cell array of FIG. 5.

FIG. 6 illustrates a timing diagram of voltage waveforms each applied to a selected source line SL, word line WL and bit line BL in a read operating mode, write operating mode and standby operating mode. Time interval T1 indicates a read operating mode. Time interval T2 indicates a set operating mode with a time interval T3 designating a reset operating mode in a write operating mode. A time interval T4 denotes a standby operating mode. Time intervals T2 and T3 may correspond to program operating sections of a general nonvolatile semiconductor memory such as a flash memory. In a write operating mode, first write path D1 (shown in FIG. 5) is used to write data '1' to a selected memory cell. As shown in time interval T2, a positive source voltage Vw is applied to the selected source line SL, a word line drive voltage Vw+Vth is applied to the selected word line WL, and voltage 2Vw which is about twice the positive source voltage is applied to selected bit line BL. Positive voltage Vw having a forward direction corresponding to direction D1 is applied to memory cell MC and a resistance value of the memory cell is changed to a high resistance. Consequently, when the write operation is obtained through first write path D1 by the applied voltage condition illustrated at time interval T2, data having a first state '1' is written to the selected memory cell.

In the write operating mode, second write path D2 (shown in FIG. 5) is used to write data '0' to a selected memory cell. In this case, as shown in the time interval T3, positive source voltage Vw is maintained in the selected source line SL, word line drive voltage Vw+Vth is applied to the selected word line WL, and ground voltage (i.e., 0V) is applied to the selected bit line BL. A negative voltage –Vw having a backward direction D2 is applied to memory cell MC and a resistance value of the memory cell is again changed to a low resistance. Consequently, when the write operation is obtained through the second write path D2 by the applied voltage condition as illustrated at time interval T3, data having a second state '0' is written to the selected memory cell. Accordingly, in writing data '0' the source line voltage and the word line voltage are maintained equally when writing data '1' and the voltage applied to the bit line is determined by 2Vw. A negative voltage value is not applied to the other lines including the bit line obviating the need for a negative voltage generator installed in the memory chip. Additionally, as the source line voltage and the word line voltage are maintained equally when writing data '1' and '0', a random write operation to an optional memory cell can be performed.

In the standby operating mode shown at time interval T4, the voltage of source line SL, word line WL and bit line BL is maintained at ground (i.e., 0V.) In the read operating mode as shown at time interval T1, ground voltage is applied to the selected source line SL, word line drive voltage Vcc is applied to the selected word line WL, and clamping voltage VBL is applied to the selected bit line BL. A sense amplifier 200 connected to the selected bit line BL senses a through-current flowing through the bit line. When the selected memory cell is under a set state '1', the through-current is smaller than the reference current because of the high resistance value of the memory cell and the read data is output as a logic '1'. Conversely, when the memory cell is in a reset state, more through-current flows because of the low resistance value of the memory cell and a logic '0' is output as read data.

Figure 7:
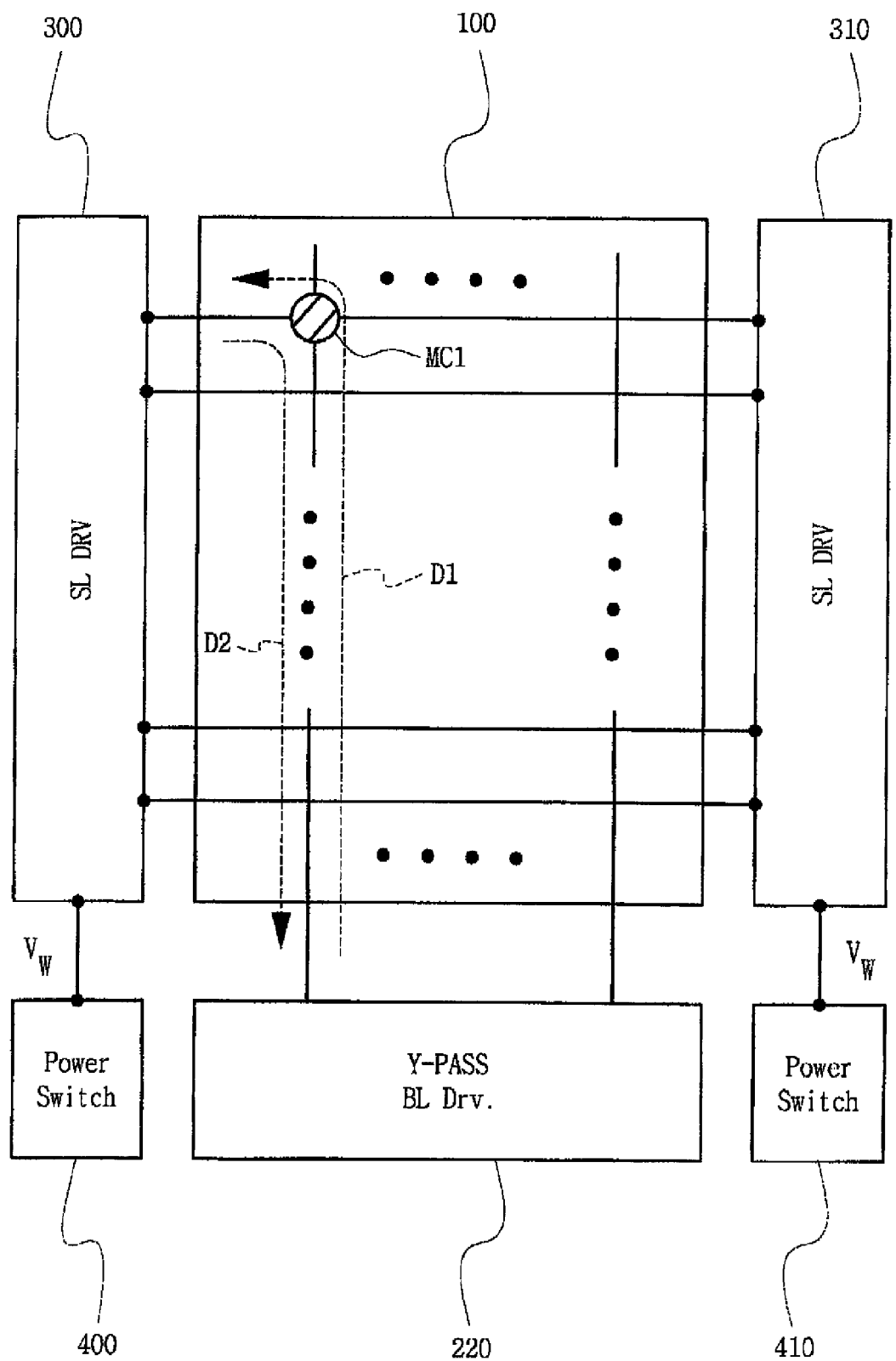
FIG. 7 is a block diagram illustrating a supply structure of source voltage applied to a memory cell block according to the present invention.

FIG. 7 is a block diagram illustrating a structure to supply greater source voltage to a memory cell block. Source line drivers 300 and 310 drive a source line voltage to cell block 100. AY-path and bit line driver 220 is connected to the bit line of cell block 100 in a column direction. Power switch 400 supplies voltage Vw to source line driver 300. Power switch 410 supplies voltage Vw to source line driver 310. In a write operation, only the power switch (400 or 410) of a selected cell block is enabled and the source line voltage is applied to only the selected cell block. In this manner, the power line layout forming the network structure for cell block 100 solves the voltage supply delay and weakness problems experienced when voltage is supplied to an area of memory cell block 100 which is located far from the power source.

As described above, chip area occupation can be reduced by a source line sharing structure in a resistance random access memory. The source line potential and bit line potential can be determined within a positive voltage level range in a write operating mode. In addition, when writing data having different logic levels to a memory cell sharing a source line, the source line is maintained at a constant voltage to enable a random write mode to the memory device. This obviates the need for a negative voltage generator to produce a write operation current, thereby enabling a high speed write operation through a random write operation.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A resistance random access memory (RRAM) in which a write operation writing data having a first state and a second state to a selected memory cell is performed through first and second write paths formed in mutually opposite directions, the memory comprising:
   a plurality of word lines;
   a plurality of bit lines;
   a memory cell array having a plurality of memory cells which are disposed at the intersections of the word and bit lines to form a matrix of rows and columns and each have an access transistor and a resistive memory device, wherein the resistive memory device is formed of SrZrO3 disposed between a top electrode and a bottom electrode; and
   a plurality of source lines each disposed between every two word lines and in the same direction as the word lines, and each connected to source terminals of corresponding access transistors having gate terminals connected to corresponding two word lines,
   wherein when the first state and the second state write operations are performed respectively, a selected source line voltage and a selected word line voltage are maintained equally, and the selected source line voltage during the first state and the second state write operations is a positive voltage.

2. The memory of claim 1, wherein each of the plurality of source lines is shared by every cell block including a predetermined number of memory cells.

3. The memory of claim 1, wherein the data having the first state and the second state is written to a selected one of the memory cells by changing a resistance value associated with a resistive memory device of the selected memory cell by current flowing through the top and bottom electrodes of the selected resistive memory device.

4. The memory of claim 1, wherein the first write path is associated with writing the data having the first state, and the second write path is associated with writing the data having the second state.

5. The memory of claim 4, wherein the first write path operates as a path of performing a program operation and the second write path operates as a path of performing an erase operation such that in the program and the erase operations, a positive voltage and a ground voltage are individually applied to a selected bit line of the bit lines without an applied negative voltage.

6. The memory of claim 1, wherein a potential of a selected bit line of the plurality of bit lines is a positive voltage.

7. The memory of claim 1, wherein in a read operating mode of the resistance random access memory, a drive voltage is applied to a selected one of the plurality of word lines, a ground voltage is applied to the selected source line and a clamping voltage is applied to a selected one of the plurality of the bit lines.

8. A resistance random access memory (RRAM) in which a write operation writing data having a first state and a second state to a selected memory cell is performed through first and second write paths formed in mutually opposite directions, the memory comprising:
   a plurality of word lines;
   a plurality of bit lines;
   a memory cell array having a plurality of memory cells which are disposed at the intersections of the word and bit lines to form a matrix of rows and columns and each have an access transistor and a resistive memory device, wherein the resistive memory device is formed of a thin film of polycrystal material PrCaMnO3 disposed between a top electrode and a bottom electrode; and
   a plurality of source lines each disposed between every two word lines and in the same direction as the word lines, and each connected to source terminals of corresponding access transistors having gate terminals connected to corresponding two word lines, wherein when the first state and the second state write operations are performed respectively, a selected source line voltage and a selected word line voltage are maintained equally, and the selected source line voltage during the first state and the second state write operations is a positive voltage.

9. The memory of claim 8, wherein the data having the first state and the second state is written to a selected one of the memory cells by changing a resistance value associated with a resistive memory device of the selected memory cell by current flowing through the top and bottom electrodes of the selected resistive memory device.

* * * * *